United States Patent
Ando

[11] Patent Number: 6,034,386
[45] Date of Patent: Mar. 7, 2000

[54] FIELD EFFECT TRANSISTOR AND METHOD OF MANUFACTURING THE SAME

[75] Inventor: Yuji Ando, Tokyo, Japan

[73] Assignee: NEC Corporation, Tokyo, Japan

[21] Appl. No.: 09/095,680

[22] Filed: Jun. 10, 1998

[30] Foreign Application Priority Data

Jun. 16, 1997 [JP] Japan ................................. 9-158558

[51] Int. Cl.⁷ .................................................. H01L 29/74
[52] U.S. Cl. .................................... 257/280; 257/286
[58] Field of Search ............................ 257/24, 66, 280, 257/286

[56] References Cited

U.S. PATENT DOCUMENTS 5,483,089  1/1996  Terazono .

FOREIGN PATENT DOCUMENTS 4245645  9/1992  Japan .
4343438  11/1992  Japan .

OTHER PUBLICATIONS

"Negative Transconductance Resonant Tunneling Field–Effect Transistor" Capasso et al. Appl. Phys. Lett 51(7), Aug. 17, 1987; pp. 526–528.

*Primary Examiner*—Stephen D. Meier
*Attorney, Agent, or Firm*—Hayes, Soloway, Hennessey, Grossman & Hage PC

[57] ABSTRACT

A field effect transistor includes a semiconductor substrate, a channel layer, a superlattice layer having a structure of at least one quantum barrier layer of which an electron affinity is smaller than that of the channel layer and at least one quantum well layer where a resonant level of electron is generated, and an un-doped semiconductor layer, wherein these layers are formed on the semiconductor substrate in order, wherein a source electrode and a drain electrode are formed on the channel layer to be electrically connected to the channel layer, and wherein a gate electrode is formed on the un-doped semiconductor layer to have a Schottky contact.

16 Claims, 6 Drawing Sheets

6a; gate electrode
12; n-type GaAs channel layer
13; RTD structure
14; un-doped GaAs Schottky layer 6a; gate electrode
12; n-type GaAs channel layer
13; RTD structure
14; un-doped GaAs Schottky layer

- 6a; gate electrode
- 14; un-doped GaAs Schottky layer
- 13; RTD structure
- 42; p-type GaAs channel layer

- 6a; gate electrode
- 14; un-doped GaAs Schottky layer
- 13; RTD structure
- 42; p-type GaAs channel layer

FIELD EFFECT TRANSISTOR AND METHOD OF MANUFACTURING THE SAME

BACKGROUND OF THE INVENTION

1. Field of the Invention

The present invention relates to a field effect transistor (hereinafter, abbreviated to FET), more particularly to an FET using negative resistance based on the resonant tunneling effect, and a method of manufacturing the FET.

2. Description of the Related Art

An FET having a structure of resonant tunneling diode (hereinafter, abbreviated to RTD) provided between a gate electrode and channel layer has been known as an FET utilizing the resonant tunneling effect. FIG. 6 is a diagrammatically illustrated perspective view showing an FET structure. Such FET has disclosed in the literature reported on Applied Physics Letters by F. Capasso, 1987, vol. No. 51, pp. 526.

Referring to FIGS. 6A and 6B, a reference numeral 60 denotes a GaAs (Gallium/Arsenic) substrate having a semi-insulation, 61 denoting an un-doped GaAs buffer layer, 62 denoting an n-type GaAs channel layer, 63 denoting an RTD structure, and 64 denoting an n-type GaAs contact layer. As shown in FIG. 6A, a source electrode 5S and a drain electrode 5D lie on the n-type GaAs channel layer 62 to thereby have an ohmic contact. In addition, a gate electrode 6b (or an ohmic electrode) also lies on the n-type GaAs contact layer 64 to have an ohmic contact.

Referring to FIG. 6B showing a partially enlarged view indicated by a circle on FIG. 6A, the RTD structure 63 having a stacked structure includes an un-doped GaAs spacer layer 63A, an un-doped AlAs (Aluminum/Arsenic) quantum barrier layer 63B, an un-doped GaAs quantum well layer 63C, an un-doped AlAs quantum barrier layer 63D and an un-doped GaAs spacer layer 63E.

Such FET can be used for a negative resistance amplifier, a negative resistance oscillator and the like since the gate current has negative resistance characteristic.

However, the gate electrode of such FET has an ohmic electrode, therefore, current flows between not only the gate and source, but also the drain and source caused by no rectification of the RTD structure. As a result, the feedback component of current increases to thereby decrease the gain of FET, making its operation unstable.

SUMMARY OF THE INVENTION

It is therefore an object of the present invention to provide a field effect transistor capable of decreasing the feedback component of current, and method of manufacturing the field effect transistor, obtaining high gain and making operation stable.

According to a first aspect of the present invention to provide a field effect transistor having layers formed on a semiconductor substrate in the order, including a channel layer, a superlattice layer having a quantum barrier layer of which an electron affinity is smaller than that of the channel layer and a quantum well structure where a resonant level is generated, and an un-doped semiconductor layer, the transistor comprising: a source electrode and a drain electrode each electrically connected to the channel layer; and a gate electrode having Schottky contact with the un-doped semiconductor layer.

According to a second aspect of the present invention to provide a field effect transistor having layers formed on a semiconductor substrate in the order, including a channel layer, a superlattice layer having a quantum barrier layer of which sum of a bandgap and an electron affinity is larger than that of the channel layer and a quantum well structure where a resonant level of a hole is generated, and an un-doped semiconductor layer, the transistor comprising: a source electrode and a drain electrode each electrically connected to the channel layer; a gate electrode having a Schottky contact with the un-doped semiconductor layer.

According to the aspects described above, the RTD structure and the un-doped Schottky layer are formed between the channel layer and gate electrode and the gate electrode has the Schottky contact, thereby reducing feedback component and obtaining high gain and stable operation of the FET. The FET can also be used for a negative resistance amplifier, a negative resistance oscillation and the like since the gate current has a negative resistance caused by the resonant tunneling effect.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Hereinafter, embodiments of the present invention will be described with reference to the drawings.

(First Embodiment)

Figure 1A:
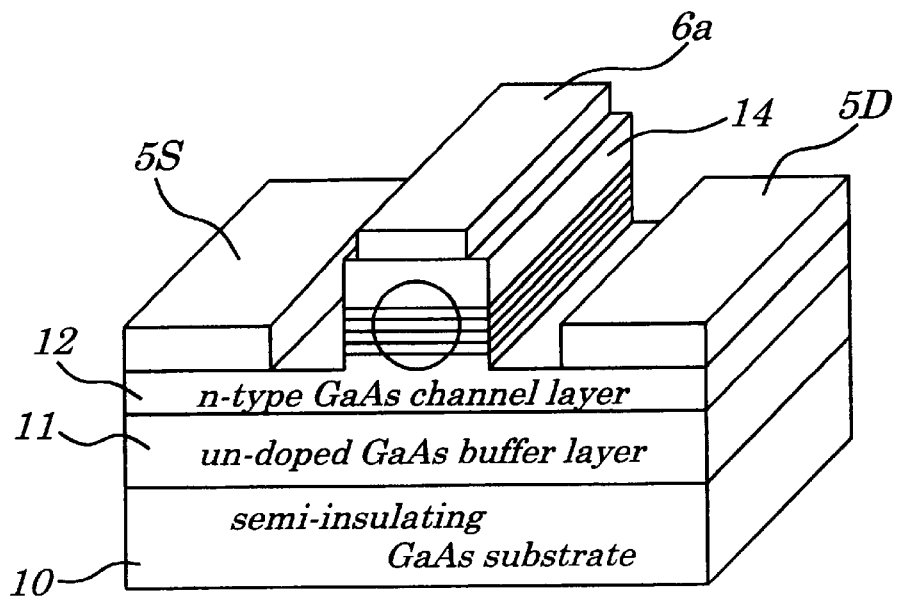
FIG. 1A is a diagrammatically illustrated perspective view showing an FET structure in a first embodiment of the present invention.
Figure 1B:
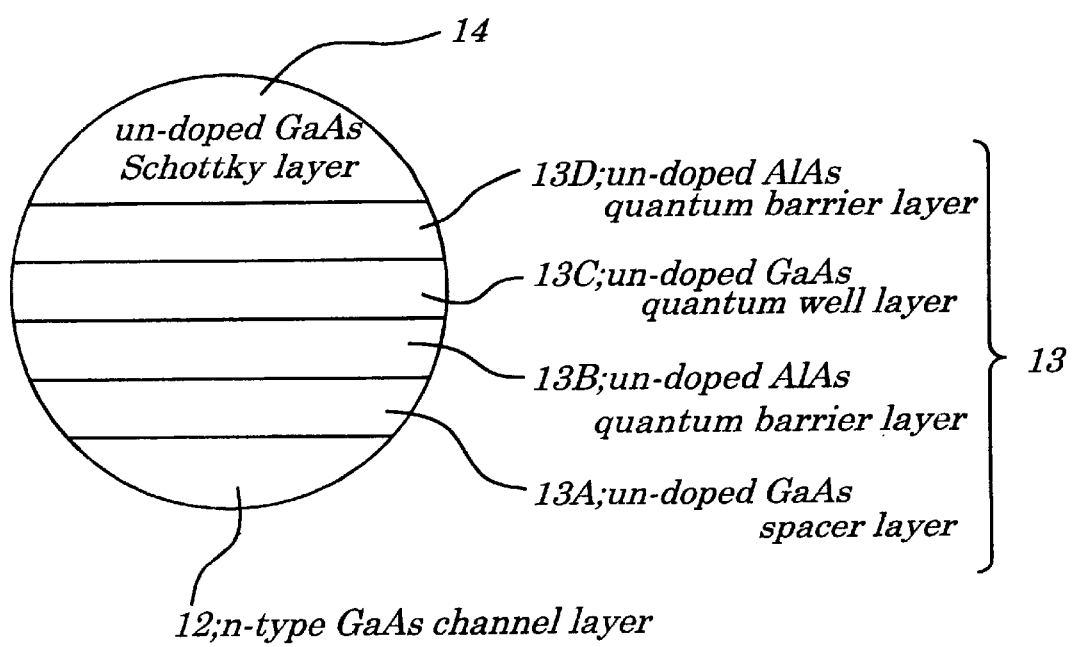
FIG. 1B is a partially enlarged view showing layers indicated by a circle on FIG. 1A.

FIG. 1A shows an FET structure and FIG. 1B shows a stacked structure indicated by a circle on FIG. 1A. Referring to FIGS. 1A and 1B, a reference numeral 10 denotes a semi-insulating GaAs substrate, 11 denoting an un-doped GaAs buffer layer, 12 denoting an n-type GaAs channel layer, 13 denoting an RTD structure, and 14 denoting an un-doped GaAs Schottky layer. As shown in FIG. 1A, a source electrode 5S and a drain electrode 5D are formed on the n-type GaAs channel layer 12 to thereby have an ohmic contact. A gate electrode 6a is also formed on the un-doped GaAs Schottky layer 14 to have a Schottky contact.

Referring to FIG. 1B, the RTD structure 13 has a stacked structure including an un-doped GaAs spacer layer 13A, an un-doped AlAs quantum barrier layer 13B, an un-doped GaAs quantum well layer 13C, and an un-doped AlAs quantum barrier layer 13D in the order of stacking those on the n-type GaAs channel layer 12. In this case, the un-doped AlAs layers 13B, 13D become quantum barriers for electron carrier to thereby form a resonant level of electron in the un-doped GaAs quantum well layer 13C which is sandwiched by the quantum barriers.

Such FET having the RTD structure 13 is manufactured by the following order.

That is, the RTD structure 13 is grown on the semi-insulating GaAs substrate 10 by the molecular beam epitaxial growth method in the following order and film thickness indicated in table 1.

TABLE 1

| | |
|---|---|
| Un-doped GaAs buffer layer 11 | 500 nm |
| n-type GaAs channel layer 12 (impurity concentration: $5 \times 10^{17}/cm^3$) | 100 nm |
| Un-doped GaAs spacer layer 13A | 5 nm |
| Un-doped AlAs quantum barrier layer 13B | 2 nm |
| Un-doped GaAs quantum well layer 13C | 5 nm |
| Un-doped AlAs quantum barrier layer 13D | 2 nm |
| Un-doped GaAs Schottky layer 14 | 40 nm |

A part of the RTD structure 13 or epitaxial layered structure formed by the growth method described above is then etched until the un-doped GaAs buffer layer 11 is exposed to form a device-isolated mesa. Subsequently, the RTD structure 13 is etched until the n-type GaAs channel layer 12 is exposed to form an RTD-formed mesa.

In addition, a metal such as AuGe/Ni/Au is deposited on the n-type GaAs channel layer 12 by the vapor deposition method to form both the source electrode 5S and drain electrode 5D, forming an ohmic contact.

Finally, a metal such as Ti/Pt/Au is deposited on the un-doped GaAs Schottky layer 14 formed on the RTD-formed mesa to form the gate electrode 6a, forming an ohmic contact, thus, an FET shown in FIGS. 1A and 1B is manufactured.

Figure 2A:
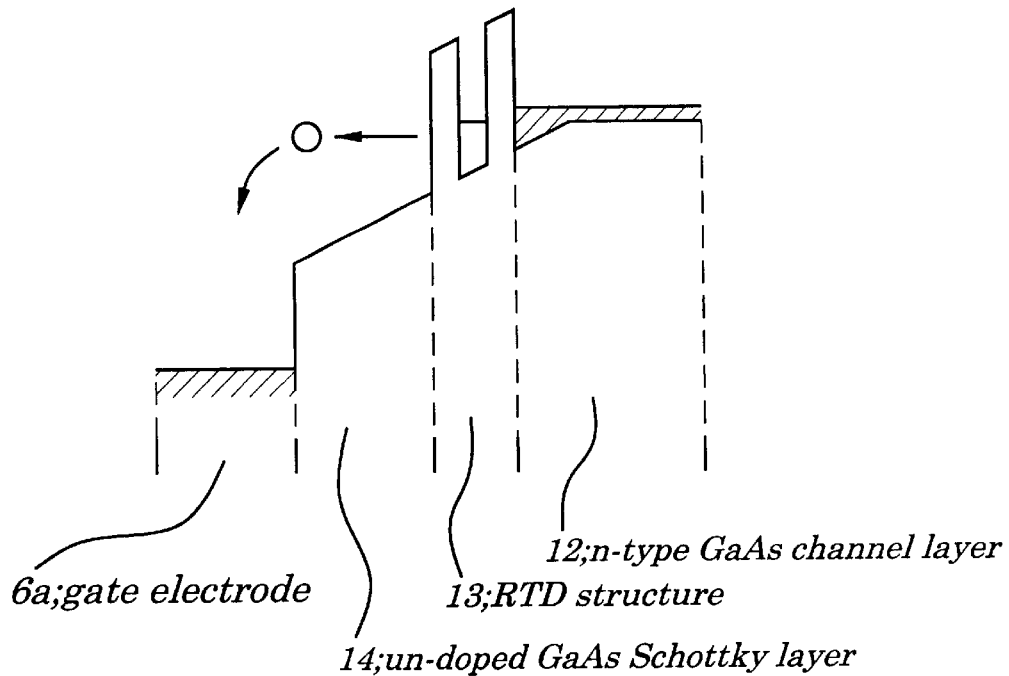
FIG. 2A is an explanatory view showing a conduction band potential in the case of applying a positive voltage between the gate and channel of FET.
Figure 2B:
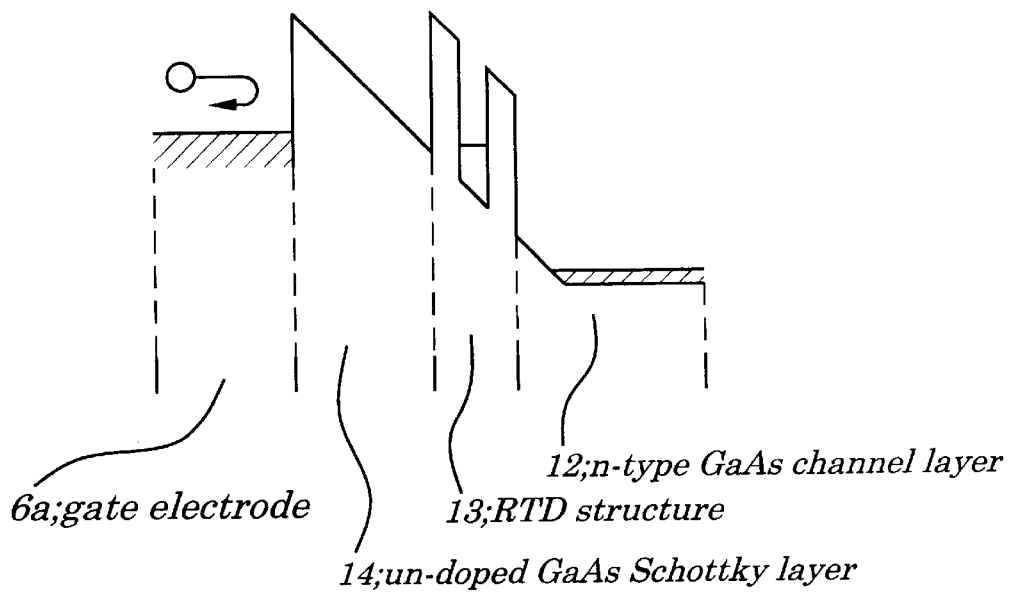
FIG. 2B is an explanatory view showing a conduction band potential in applying a negative voltage between the gate and channel of FET.

FIGS. 2A and 2B are diagrams showing a conduction band potential between the gate and channel of the FET described above. Referring to FIG. 2A, an electron is moved into the un-doped GaAs Schottky layer 14 by the resonant tunneling effect in applying a positive voltage between the gate and channel. This is a case of condition under coinciding the ground state energy of electron generated in the un-doped GaAs quantum well layer 13C with Fermi-level in the n-type GaAs channel layer 12. Therefore, a gate current flows into an interface between the gate electrode 6a and the un-doped GaAs Schottky layer 14 because of no potential barrier against the electron.

On the other hand, referring to FIG. 2B, the gate current does not flow due to the reflection of electron in the gate metal or gate electrode 6a in applying a negative voltage between the gate and channel. This is because the potential barrier against an electron lies in the interface between the gate electrode 6a and the un-doped GaAs Schottky layer 14.

With such principle described above, the RTD structure 13 may have rectification even though this does not primarily have it. In the case of ordinary FET operation, a positive voltage (ex. 0.4 volts) is applied between the gate and source, and a positive voltage (ex. 2.0 volts) is applied between the drain and source. Therefore, impedance between the gate and drain becomes high so that a negative voltage (ex. −1.6 volts) occurs between the gate and drain, thereby reducing a feedback component.

In such FET described above, the RTD structure 13 intervenes between the n-type GaAs channel layer 12 and the gate electrode 6a. The gate current therefore has a negative resistance characteristic in accordance with the resonant tunneling effect of electron, so that the FET can be used for a negative resistance amplifier, a negative resistance oscillator and the like.

(Second Embodiment)

Figure 3A:
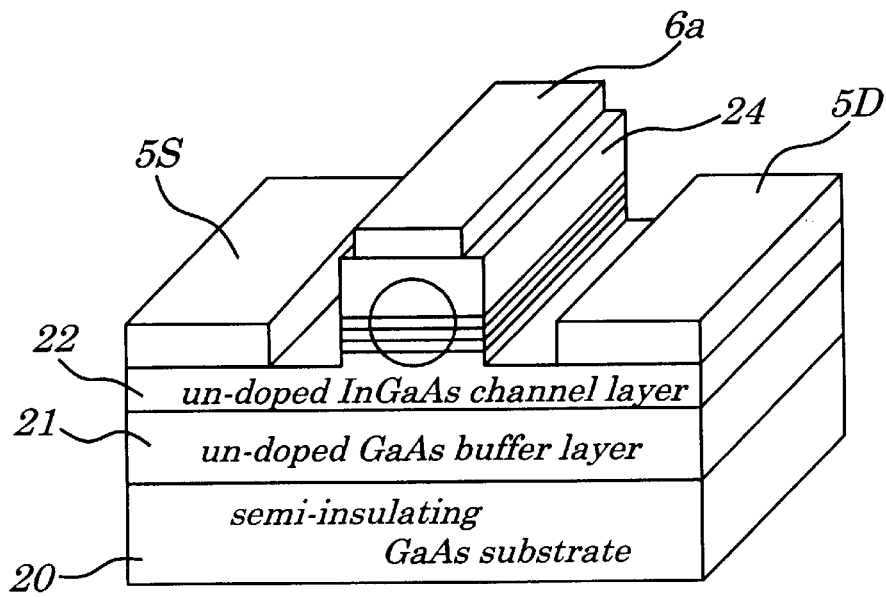
FIG. 3A is a diagrammatically illustrated perspective view showing an FET structure in a second embodiment of the present invention.
Figure 3B:
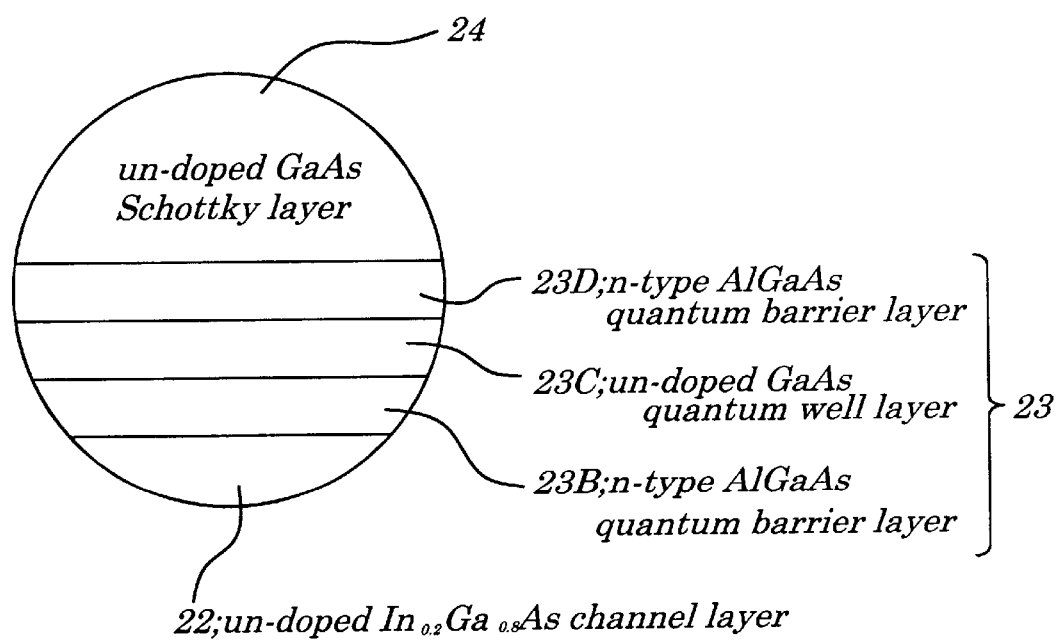
FIG. 3B is a partially enlarged view showing layers indicated by a circle on FIG. 3A.

FIG. 3A shows another FET structure and FIG. 3B shows a stacked structure indicated by a circle on FIG. 3A. Referring to FIGS. 3A and 3B, a reference numeral 20 denotes a semi-insulating GaAs substrate, 21 denoting an un-doped GaAs buffer layer, 22 denoting an un-doped $In_{0.2}Ga_{0.8}As$ channel layer, 23 denoting an RTD structure, and 24 denoting an un-doped GaAs Schottky layer. It is noted that the un-doped $In_{0.2}Ga_{0.8}As$ channel layer 22 is a strained layer, the thickness of which is equal to or smaller than a critical film thickness which occurs dislocation caused by lattice mismatching. A source electrode 5S and a drain electrode 5D are also formed on the un-doped $In_{0.2}Ga_{0.8}As$ channel layer 22 to thereby form an ohmic contact. In addition, a gate electrode 6a is formed on the un-doped GaAs Schottky layer 24 to form a Schottky contact.

Referring to FIG. 3B, the RTD structure 23 has a stacked structure including an n-type $Al_{0.4}Ga_{0.6}As$ quantum barrier layer 23B, an un-doped GaAs quantum well layer 23C, and an n-type $Al_{0.4}Ga_{0.6}As$ quantum barrier layer 23D.

Such RTD structure of FET also has the rectification similar to the structure described in the first embodiment, reducing feedback component in the operation of FET. The gate current also has negative resistance characteristic in accordance with the resonant tunneling effect of electron, and the FET can be used for a negative resistance amplifier, negative resistance oscillator and the like. Moreover, the un-doped $In_{0.2}Ga_{0.8}As$ channel layer 22 has high electron mobility in the case of this embodiment, enabling high speed operation.

(Third Embodiment)

Figure 4A:
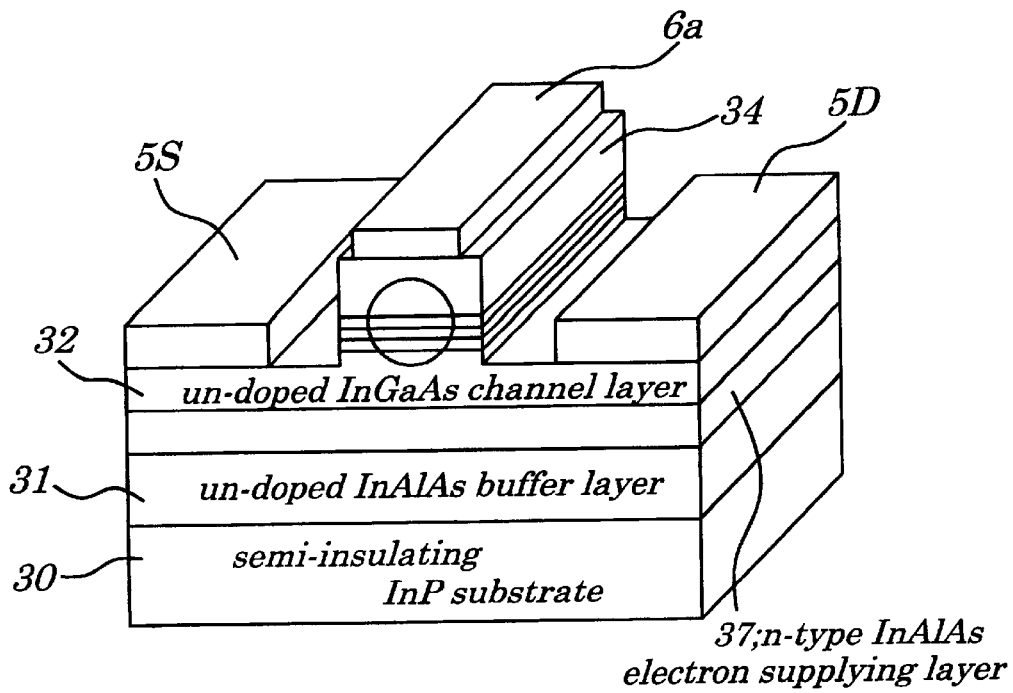
FIG. 4A is a diagrammatically illustrated perspective view showing an FET structure in a third embodiment of the present invention.
Figure 4B:
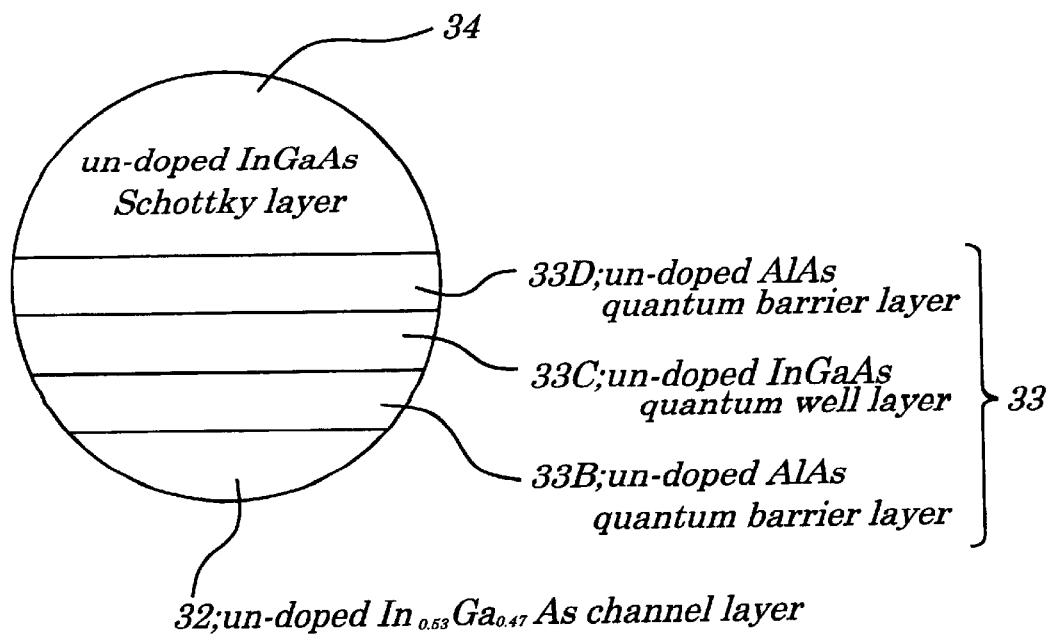
FIG. 4B is a partially enlarged view showing layers indicated by a circle on FIG. 4A.

FIG. 4A shows another FET structure and FIG. 4B shows a stacked structure indicated by a circle on FIG. 4A. Referring to FIGS. 4A and 4B, an reference numeral 30 denotes a semi-insulating InP (Indium/Phosphorus) substrate, 31 denoting an un-doped $In_{0.52}Al_{0.48}As$ buffer layer, 37 denoting an n-type $In_{0.52}Al_{0.48}As$ electron supplying layer, 32 denoting an un-doped $In_{0.53}Ga_{0.47}As$ channel layer, 33 denoting an RTD structure, and 34 denoting an un-doped $In_{0.53}Ga_{0.47}As$ Schottky layer. A source electrode 5S and a drain electrode 5D are formed on the un-doped $In_{0.53}Ga_{0.47}As$ channel layer 32 to thereby form an ohmic contact. A gate electrode 6a is also formed on the un-doped $In_{0.53}Ga_{0.47}As$ Schottky layer 34 to form a Schottky contact. The n-type $In_{0.52}Al_{0.48}As$ electron supplying layer 37 has a smaller electron affinity than the un-doped $In_{0.53}Ga_{0.47}As$ channel layer 32 to thereby serve as an electron supplying layer.

Referring to FIG. 4B, the RTD structure 33 has a stacked structure including an un-doped AlAs quantum barrier layer 33B, an un-doped $In_{0.53}Ga_{0.47}As$ quantum well layer 33C, and an un-doped AlAs quantum barrier layer 33D.

Such RTD structure of FET also has the rectification similar to the structure describe in the first embodiment, reducing feedback component in the operation of FET. The gate current also has negative resistance characteristic in accordance with the resonant tunneling effect of electron, and the FET can be used for a negative resistance amplifier, negative resistance oscillator and the like. Moreover, the un-doped $In_{0.53}Ga_{0.47}As$ channel layer 32 has high electron mobility in this embodiment, enabling high speed operation. The un-doped $In_{0.53}Ga_{0.47}As$ channel layer 32 serving as a barrier against an impurity such as fluorine (or F) also lies on the n-type $In_{0.52}Al_{0.48}As$ electron supplying layer 37, so that the n-type $In_{0.52}Al_{0.48}As$ electron supplying layer 37 is not contaminated from it, enhancing thermal reliability.

(Fourth Embodiment)

The fourth embodiment is described with reference to FIGS. 1A and 1B. This embodiment is that the n-type GaAs channel layer 12 shown in FIG. 1A is replaced with a p-type GaAs channel layer 42 as diagrammatically shown in FIGS. 5A and 5B. Referring to FIG. 1B, the un-doped AlAs quantum barrier layers 13B, 13D have sum of a bandgap and electron affinity greater than that of the p-type GaAs channel layer 42. Therefore, the un-doped AlAs quantum barrier layers 13B, 13D become a quantum barrier against hole carrier, so that a hole resonant level is formed in the un-doped GaAs quantum well layer 13C.

Figure 5A:
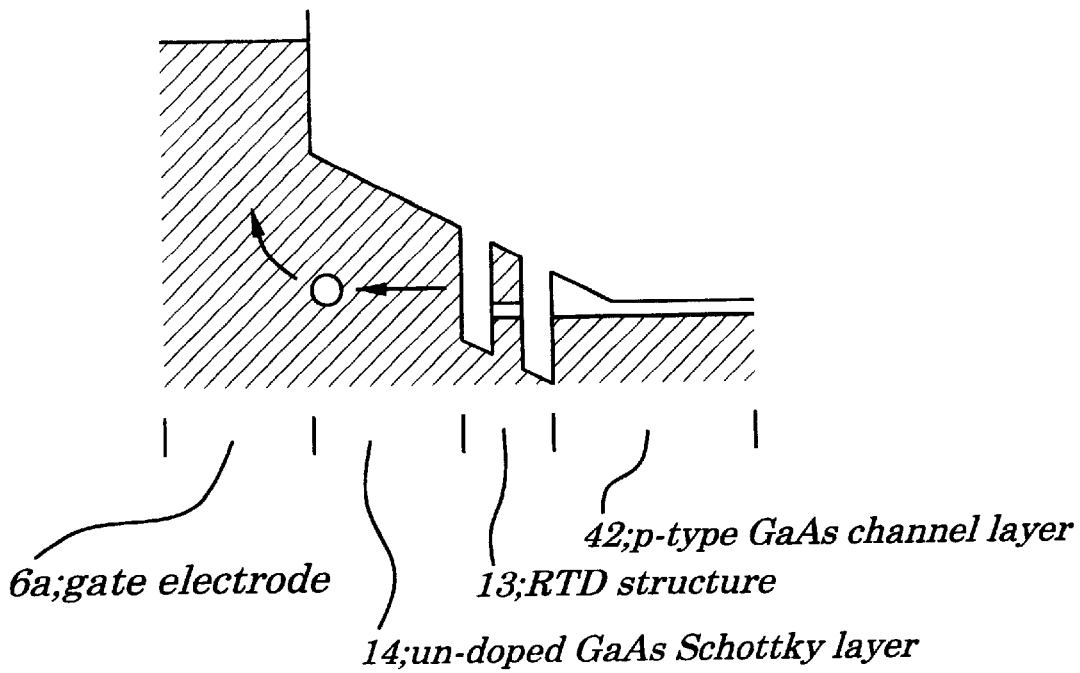
FIG. 5A is an explanatory view showing a valence band potential in applying a negative voltage between the gate and channel of FET.
Figure 5B:
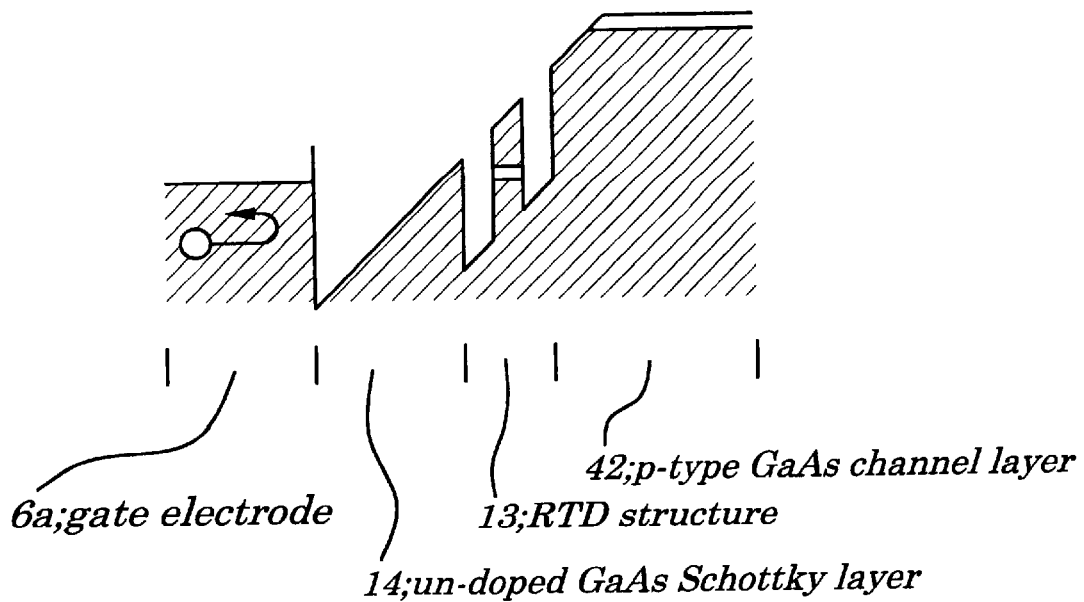
FIG. 5B is an explanatory view showing a valence band potential in applying a positive voltage between the gate and channel of FET.
Figure 6A:
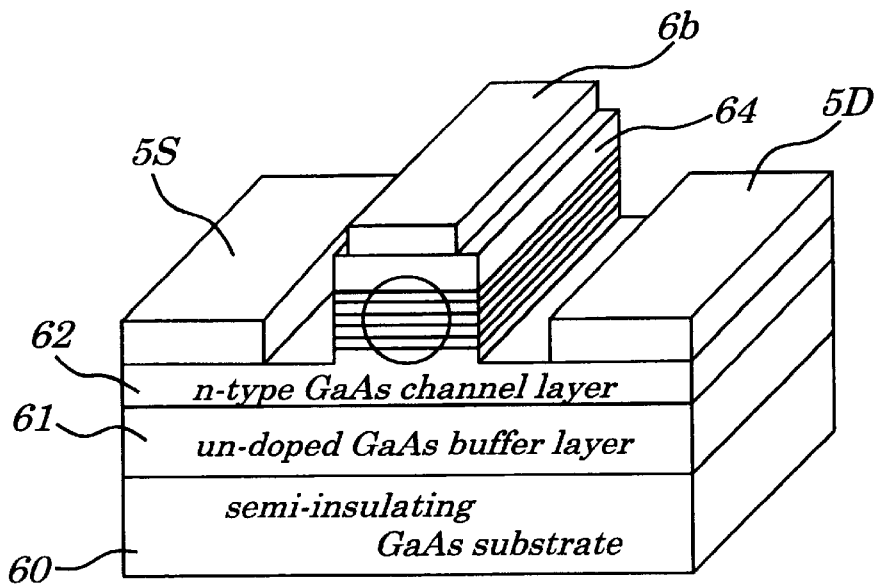
FIG. 6A is a diagrammatically illustrated perspective view showing an FET structure for explaining a related art of the present invention.
Figure 6B:
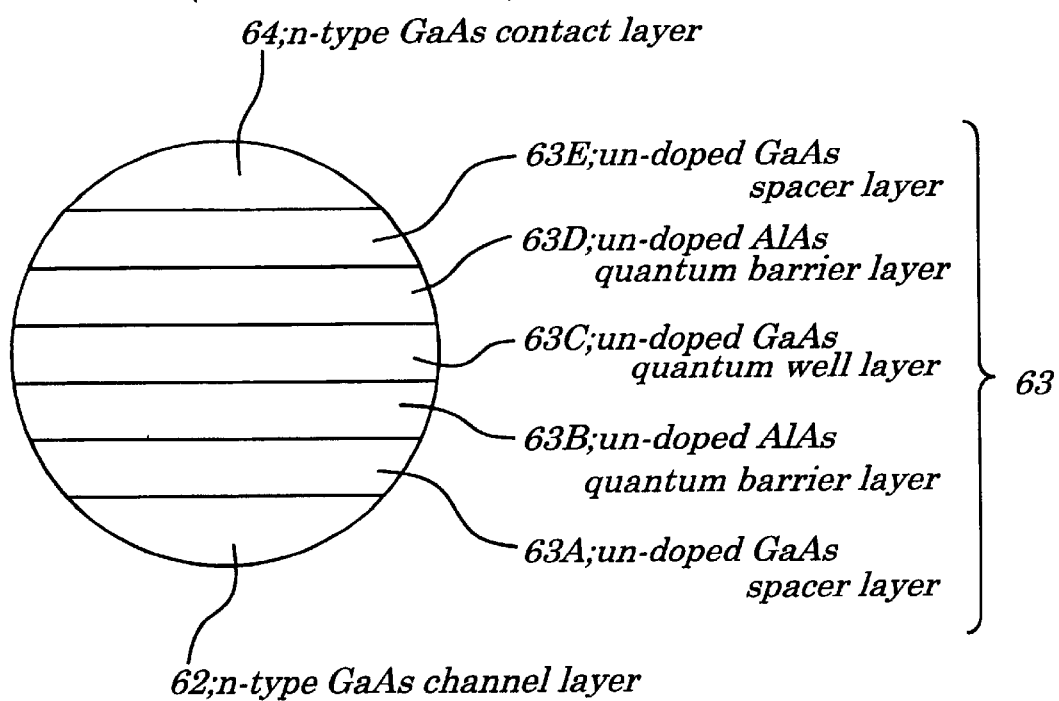
FIG. 6B is a partially enlarged view showing layers indicated by a circle on FIG. 6A.

FIGS. 5A and 5B are diagrams showing a valence band potential between the gate and channel of the FET described in the fourth embodiment.

Referring to FIG. 5A, a hole is moved into the un-doped GaAs Schottky layer 14 by the resonant tunneling effect in applying a negative voltage between the gate and channel of FET. This is a case of condition under coinciding the ground state energy of a heavy hole generated in the un-doped GaAs quantum well layer 13C with Fermi-level in the p-type GaAs channel layer 42. Therefore, a gate current flows into an interface between the gate electrode 6a and the un-doped GaAs Schottky layer 14 because of no potential barrier against the hole.

Referring to FIG. 5B, the gate current does not flow due to the reflection of hole in the gate electrode 6a in applying a positive voltage between the gate and channel. This is because the potential barrier against the hole lies in the interface between the gate electrode 6a and the un-doped GaAs Schottky layer 14.

According to such principle described above, the RTD structure 13 may have rectification even though such structure does not primarily have the rectification. In the case of ordinary FET operation, a negative voltage (ex. −0.4 volts) is applied between the gate and source while a negative voltage (ex. −2 volts) is applied between the drain and source. Because of this, impedance between the gate and drain becomes high so that a positive voltage (ex. +1.6 volts) occurs between the gate and drain, reducing a feedback component.

In such FET described above, the RTD structure 13 intervenes between the p-type GaAs channel layer 42 and the gate electrode 6a. The gate current therefore has a negative resistance characteristic in accordance with the resonant tunneling effect of hole, so that the FET can be used for a negative resistance amplifier, a negative resistance oscillator and the like.

(Fifth Embodiment)

The fifth embodiment is described with reference to FIG. 3B. This embodiment is that the n-type $Al_{0.4}Ga_{0.6}As$ quantum barrier layers 23B, 23D shown in FIG. 3B are replaced with p-type $Al_{0.4}Ga_{0.6}As$ quantum barrier layers, which is not illustrated in the drawing.

Such RTD structure of FET also has the rectification similar to the structure described in the fourth embodiment, reducing a feedback component in the operation of FET. The gate current also has negative resistance characteristic in accordance with the resonant tunneling effect of hole, and the FET can be used for a negative resistance amplifier, negative resistance oscillator and the like. Furthermore, the un-doped $In_{0.2}Ga_{0.8}As$ channel layer 22 has a high hole mobility, enabling a high speed operation.

(Sixth Embodiment)

The sixth embodiment is described with reference to FIG. 4A. This embodiment is that the n-type $In_{0.52}Al_{0.48}As$ electron supplying layer 37 shown in FIG. 4B is replaced with a p-type $In_{0.52}Al_{0.48}As$ hole supplying layer, which is not illustrated in the drawing. The p-type $In_{0.52}Al_{0.48}As$ hole supplying layer has a sum of a bandgap and electron affinity which is greater than that of the un-doped $In_{0.53}Ga_{0.47}As$ channel layer 32 to thereby serve as a hole supplying layer.

Such RTD structure of FET also has the rectification similar to the structure described in the fourth embodiment, reducing a feedback component in the operation of FET. The gate current also has negative resistance characteristic in accordance with the resonant tunneling effect of hole, and the FET can be used for a negative resistance amplifier, negative resistance oscillator and the like. In this embodiment, the un-doped $In_{0.53}Ga_{0.47}As$ channel layer 32 has a high hole mobility, enabling a high speed operation.

It is thus apparent that the present invention is not limited to the above embodiments but may be changed and modified without departing from the scope and spirit of the invention.

Finally, the present application claims the priority of Japanese Patent Application No. Hei09-158558 filed Jun. 16, 1997, which is herein incorporated by reference.

What is claimed is:

1. A field effect transistor comprising:
   a semiconductor substrate; a channel layer; a superlattice layer having a structure of at least one quantum barrier layer of which an electron affinity is smaller than that of the channel layer and at least one quantum well layer where a resonant level of electron is generated; and an un-doped semiconductor layer, wherein these layers are formed on the semiconductor substrate in order, wherein a source electrode and a drain electrode are formed on the channel layer to be electrically connected to the channel layer, and wherein a gate electrode is formed on the un-doped semiconductor layer to have a Schottky contact.

2. A field effect transistor according to claim 1, wherein the channel layer includes an n-type semiconductor.

3. A field effect transistor according to claim 1, wherein the superlattice layer includes one n-type layer at least.

4. A field effect transistor according to claim 1, wherein the channel layer includes an un-doped semiconductor.

5. A field effect transistor according to claim 1, further comprising, an electron supplying layer contacted to the channel layer, lying opposite to the superlattice layer and having at least one n-type layer, the electron supplying layer having the electron affinity smaller than that of the channel layer.

6. A field effect transistor according to claim 1, wherein the superlattice layer is a resonant tunneling diode structure.

7. A field effect transistor according to claim 6, wherein the superlattice layer includes an un-doped GaAs spacer layer, an un-doped AlAs quantum barrier layer, an un-doped GaAs quantum well layer, and the un-doped AlAs quantum barrier layer, these layers being formed on the channel layer in order.

8. A field effect transistor according to claim 6, wherein the superlattice layer includes an n-type AlGaAs quantum barrier layer, an an-doped GaAs quantum well layer, and the n-type AlGaAs quantum barrier layer, these layers being formed on the channel layer in order.

9. A field effect transistor according to claim 6, wherein the superlattice layer includes an un-doped AlAs quantum barrier layer, an un-doped InGaAs quantum well layer, and the un-doped AlAs quantum barrier layer, these layers being formed on the channel layer in order.

10. A field effect transistor according to claim 1, wherein an un-doped buffer layer intervenes between the semiconductor substrate and the channel layer.

11. A field effect transistor comprising: a semiconductor substrate; a channel layer; a superlattice layer having a structure of at least one quantum barrier layer of which a sum of a bandgap and an electron affinity is larger than that of the channel layer and at least one quantum well layer where a resonant level of hole is generated; and an un-doped semiconductor layer, wherein these layers being formed on the semiconductor substrate in order, wherein a source electrode and a drain electrode are formed on the channel layer to be electrically connected to the channel layer, and wherein a gate electrode is formed on the un-doped semiconductor layer to have a Schottky contact.

12. A field effect transistor according to claim 11, wherein the channel layer includes a p-type semiconductor.

13. A field effect transistor according to claim 11, wherein the superlattice layer includes one p-type layer at least.

14. A field effect transistor according to claim 11, wherein the channel layer includes an un-doped semiconductor.

15. A field effect transistor according to claim 11, further comprising, a hole supplying layer contacted to the channel layer, lying opposite to the superlattice layer and having at least one p-type layer, the hole supplying layer having a sum of the electron affinity and bandgap which is larger than that of the channel layer.

16. A field effect transistor according to claim 11, wherein the superlattice layer is a resonant tunneling diode structure.

* * * * *

UNITED STATES PATENT AND TRADEMARK OFFICE
CERTIFICATE OF CORRECTION

PATENT NO. : 6,034,386  Page 1 of 1
DATED : March 7, 2000
INVENTOR(S) : Ando

It is certified that error appears in the above-identified patent and that said Letters Patent is hereby corrected as shown below:

<u>Claim 8, column 7,</u>
Line 3, "an-doped" should be -- un-doped --

Signed and Sealed this

Twenty-fifth Day of September, 2001

Attest:

*Attesting Officer*

NICHOLAS P. GODICI
*Acting Director of the United States Patent and Trademark Office*